US012696784B2

(12) United States Patent
Lin et al.

(10) Patent No.: US 12,696,784 B2
(45) Date of Patent: Jul. 28, 2026

(54) METHOD OF MAKING SEMICONDUCTOR DEVICE HAVING REDUCED BUMP HEIGHT VARIATION

(71) Applicant: TAIWAN SEMICONDUCTOR MANUFACTURING COMPANY, LTD., Hsinchu (TW)

(72) Inventors: Jing-Cheng Lin, Chu Tung Zhen (TW); Po-Hao Tsai, Zhongli City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 25 days.

(21) Appl. No.: 18/608,296

(22) Filed: Mar. 18, 2024

(65) Prior Publication Data

US 2024/0222318 A1 Jul. 4, 2024

Related U.S. Application Data

(60) Continuation of application No. 16/936,112, filed on Jul. 22, 2020, now Pat. No. 11,935,866, which is a
(Continued)

(51) Int. Cl.
*H10W 72/00* (2026.01)
*B23K 1/00* (2006.01)
(Continued)

(52) U.S. Cl.
CPC ......... *H10W 72/073* (2026.01); *B23K 1/0016* (2013.01); *H10W 20/023* (2026.01);
(Continued)

(58) Field of Classification Search
CPC .............. H01L 24/83; H01L 21/76898; H01L 23/49816; H01L 23/49838; H01L 24/11;
(Continued)

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |

(Continued)

FOREIGN PATENT DOCUMENTS

| | | | |
|---|---|---|---|
| JP | 3704402 B2 | 10/2005 | |

*Primary Examiner* — Douglas W Owens
(74) *Attorney, Agent, or Firm* — Hauptman Ham, LLP

(57) ABSTRACT

A method of making a semiconductor device includes patterning a photoresist on a substrate to form a plurality of openings. A first opening has a first width, a second opening has a second width, smaller than the first width, and a third opening is between the first opening and the second opening and has a third width, different from the first width and the second width. The width is measured in a direction parallel to a top surface of the substrate. The method further includes plating a first conductive material into each opening of the plurality of openings in the photoresist. Plating the first conductive material includes plating of the first conductive material to a first height in the first opening, plating the first conductive material to a second height in the second opening, and plating the first conductive material to a third height in the third opening.

20 Claims, 11 Drawing Sheets

Related U.S. Application Data continuation of application No. 15/497,669, filed on Apr. 26, 2017, now Pat. No. 10,741,520, which is a division of application No. 13/403,511, filed on Feb. 23, 2012, now Pat. No. 9,646,942.

(51) Int. Cl.

| | |
|---|---|
| *B23K 101/42* | (2006.01) |
| *H10W 20/00* | (2026.01) |
| *H10W 70/63* | (2026.01) |
| *H10W 70/65* | (2026.01) |
| *H10W 72/20* | (2026.01) |
| *H10W 72/29* | (2026.01) |
| *H10W 72/90* | (2026.01) |
| *H10W 74/15* | (2026.01) |
| *H10W 90/00* | (2026.01) |

(52) U.S. Cl.

CPC ........... *H10W 70/65* (2026.01); *H10W 72/20* (2026.01); *H10W 90/701* (2026.01); *B23K 2101/42* (2018.08); *H10W 70/635* (2026.01); *H10W 72/01235* (2026.01); *H10W 72/01255* (2026.01); *H10W 72/019* (2026.01); *H10W 72/072* (2026.01); *H10W 72/222* (2026.01); *H10W 72/227* (2026.01); *H10W 72/241* (2026.01); *H10W 72/252* (2026.01); *H10W 72/29* (2026.01); *H10W 72/923* (2026.01); *H10W 72/9415* (2026.01); *H10W 72/952* (2026.01); *H10W 74/15* (2026.01); *H10W 90/724* (2026.01); *H10W 90/734* (2026.01)

(58) Field of Classification Search

CPC ......... H01L 24/13; H01L 24/14; H01L 24/17; H01L 23/49811; H01L 23/49827; H01L 24/16; H01L 2224/03912; H01L 2224/0401; H01L 2224/05027; H01L 2224/05166; H01L 2224/05181; H01L 2224/05186; H01L 2224/05572; H01L 2224/05582; H01L 2224/05647; H01L 2224/1146; H01L 2224/1147; H01L 2224/1308; H01L 2224/13083; H01L 2224/13111; H01L 2224/13113; H01L 2224/13116; H01L 2224/13139; H01L 2224/13147; H01L 2224/13155; H01L 2224/1403; H01L 2224/16225; H01L 2224/16235; H01L 2224/16238; H01L 2224/32225; H01L 2224/73204; H01L 2224/81191; H01L 2224/81193; H01L 2924/00013; H01L 2924/00014; H01L 2924/15311; H01L 2924/3841; B23K 1/0016; B23K 2101/42; H10W 72/073; H10W 20/023; H10W 70/65; H10W 72/20; H10W 90/701; H10W 70/635; H10W 72/01235; H10W 72/01255; H10W 72/019; H10W 72/072; H10W 72/222; H10W 72/227; H10W 72/241; H10W 72/252; H10W 72/29; H10W 72/923; H10W 72/9415; H10W 72/952; H10W 74/15; H10W 90/724; H10W 90/734

See application file for complete search history.

(56) References Cited

U.S. PATENT DOCUMENTS

| | | | |
|---|---|---|---|
| 5,075,253 A | | 12/1991 | Sliwa, Jr. |
| 5,380,681 A | | 1/1995 | Hsu |
| 5,481,133 A | | 1/1996 | Hsu |
| 5,933,323 A | | 8/1999 | Bhatia et al. |
| 6,002,177 A | | 12/1999 | Gaynes et al. |
| 6,060,780 A | | 5/2000 | Ohta et al. |
| 6,133,637 A | | 10/2000 | Hikita et al. |
| 6,172,874 B1 | | 1/2001 | Bartilson |
| 6,187,678 B1 | | 2/2001 | Gaynes et al. |
| 6,217,987 B1 | | 4/2001 | Ono et al. |
| 6,229,216 B1 | | 5/2001 | Ma et al. |
| 6,236,115 B1 | | 5/2001 | Gaynes et al. |
| 6,271,059 B1 | | 8/2001 | Bertin et al. |
| 6,279,815 B1 | | 8/2001 | Correia et al. |
| 6,355,501 B1 | | 3/2002 | Fung et al. |
| 6,366,462 B1 | | 4/2002 | Chu et al. |
| 6,415,974 B2 | | 7/2002 | Jao |
| 6,418,029 B1 | | 7/2002 | McKee et al. |
| 6,434,016 B2 | | 8/2002 | Zeng et al. |
| 6,448,661 B1 | | 9/2002 | Kim et al. |
| 6,461,895 B1 | | 10/2002 | Liang et al. |
| 6,490,169 B1 | | 12/2002 | Watanabe |
| 6,562,653 B1 | | 5/2003 | Ma et al. |
| 6,570,248 B1 | | 5/2003 | Ahn et al. |
| 6,600,222 B1 | | 7/2003 | Levardo |
| 6,607,938 B2 | | 8/2003 | Kwon et al. |
| 6,611,057 B2 | | 8/2003 | Mikubo et al. |
| 6,661,085 B2 | | 12/2003 | Kellar et al. |
| 6,717,812 B1 | | 4/2004 | Pinjala et al. |
| 6,762,076 B2 | | 7/2004 | Kim et al. |
| 6,790,748 B2 | | 9/2004 | Kim et al. |
| 6,887,769 B2 | | 5/2005 | Kellar et al. |
| 6,908,565 B2 | | 6/2005 | Kim et al. |
| 6,908,785 B2 | | 6/2005 | Kim |
| 6,911,733 B2 | | 6/2005 | Kikuchi et al. |
| 6,924,551 B2 | | 8/2005 | Rumer et al. |
| 6,943,067 B2 | | 9/2005 | Greenlaw |
| 6,946,384 B2 | | 9/2005 | Kloster et al. |
| 6,975,016 B2 | | 12/2005 | Kellar et al. |
| 7,015,572 B2 | | 3/2006 | Yamaji |
| 7,037,804 B2 | | 5/2006 | Kellar et al. |
| 7,056,807 B2 | | 6/2006 | Kellar et al. |
| 7,057,270 B2 | | 6/2006 | Moshayedi |
| 7,087,538 B2 | | 8/2006 | Staines et al. |
| 7,151,009 B2 | | 12/2006 | Kim et al. |
| 7,157,787 B2 | | 1/2007 | Kim et al. |
| 7,180,165 B2 | | 2/2007 | Ellsberry et al. |
| 7,215,033 B2 | | 5/2007 | Lee et al. |
| 7,276,799 B2 | | 10/2007 | Lee et al. |
| 7,279,795 B2 | | 10/2007 | Periaman et al. |
| 7,307,005 B2 | | 12/2007 | Kobrinsky et al. |
| 7,317,256 B2 | | 1/2008 | Williams et al. |
| 7,320,928 B2 | | 1/2008 | Kloster et al. |
| 7,345,350 B2 | | 3/2008 | Sinha |
| 7,362,580 B2 | | 4/2008 | Hua et al. |
| 7,402,442 B2 | | 7/2008 | Condorelli et al. |
| 7,402,515 B2 | | 7/2008 | Arana et al. |
| 7,410,884 B2 | | 8/2008 | Ramanathan et al. |
| 7,432,592 B2 | | 10/2008 | Shi et al. |
| 7,494,845 B2 | | 2/2009 | Hwang et al. |
| 7,528,494 B2 | | 5/2009 | Furukawa et al. |
| 7,531,890 B2 | | 5/2009 | Kim |
| 7,557,597 B2 | | 7/2009 | Anderson et al. |
| 7,564,130 B1* | | 7/2009 | Li ........................... H01L 24/13 |
| | | | 257/772 |
| 7,576,435 B2 | | 8/2009 | Chao |
| 7,611,923 B2 | | 11/2009 | Fasano et al. |
| 7,834,450 B2 | | 11/2010 | Kang |
| 8,362,613 B2 | | 1/2013 | Yadav et al. |
| 8,653,658 B2 | | 2/2014 | Lin et al. |
| 8,803,339 B1 | | 8/2014 | Azeroual |
| 9,190,373 B2 | | 11/2015 | Migita et al. |
| 9,548,251 B2 | | 1/2017 | Khan et al. |
| 9,818,728 B2 | | 11/2017 | Chandolu |
| 10,741,520 B2* | | 8/2020 | Lin ................... H01L 23/49838 |
| 2002/0033412 A1 | | 3/2002 | Tung |
| 2004/0124540 A1* | | 7/2004 | Chen ................. H01L 23/49816 |
| | | | 257/E23.021 |
| 2004/0190255 A1 | | 9/2004 | Cheon |
| 2004/0265562 A1 | | 12/2004 | Uzoh |
| 2005/0016859 A1 | | 1/2005 | Huang |

(56) References Cited

U.S. PATENT DOCUMENTS

| | | |
|---|---|---|
| 2005/0067694 A1 | 3/2005 | Pon et al. |
| 2006/0126309 A1 | 6/2006 | Bolle et al. |
| 2007/0158199 A1 | 7/2007 | Haight |
| 2007/0235217 A1 | 10/2007 | Workman |
| 2007/0240900 A1 | 10/2007 | Yokomaku |
| 2007/0241449 A1 | 10/2007 | Colbert et al. |
| 2008/0003804 A1* | 1/2008 | Nalla ..................... H01L 24/11 |
| | | 257/E23.021 |
| 2008/0003805 A1* | 1/2008 | Pang ...................... H01L 24/12 |
| | | 438/615 |
| 2008/0048245 A1 | 2/2008 | Kito et al. |
| 2008/0054459 A1 | 3/2008 | Lee |
| 2008/0225493 A1 | 9/2008 | Barth |
| 2008/0290136 A1* | 11/2008 | Murayama ........... B23K 3/0638 |
| | | 228/8 |
| 2009/0052134 A1 | 2/2009 | Casteel et al. |
| 2009/0108341 A1 | 4/2009 | Chung |
| 2009/0294954 A1 | 12/2009 | Bakir et al. |
| 2010/0019377 A1 | 1/2010 | Arvelo et al. |
| 2010/0117209 A1 | 5/2010 | Bezama et al. |
| 2010/0127390 A1 | 5/2010 | Barth |
| 2010/0187682 A1 | 7/2010 | Pinjala et al. |
| 2010/0187683 A1 | 7/2010 | Bakir et al. |
| 2010/0308443 A1 | 12/2010 | Suthiwongsunthorn |
| 2011/0018130 A1 | 1/2011 | Yamada |
| 2011/0092064 A1 | 4/2011 | Liu et al. |
| 2011/0095418 A1 | 4/2011 | Lim et al. |
| 2011/0101527 A1 | 5/2011 | Cheng et al. |
| 2011/0205708 A1 | 8/2011 | Andry et al. |
| 2011/0248398 A1 | 10/2011 | Parvarandeh et al. |
| 2012/0091578 A1 | 4/2012 | Chen |
| 2013/0134581 A1 | 5/2013 | Lin et al. |
| 2013/0147030 A1 | 6/2013 | Chang |
| 2013/0193570 A1 | 8/2013 | Kuo et al. |
| 2017/0278816 A1* | 9/2017 | Li ........................... H01L 24/11 |

* cited by examiner

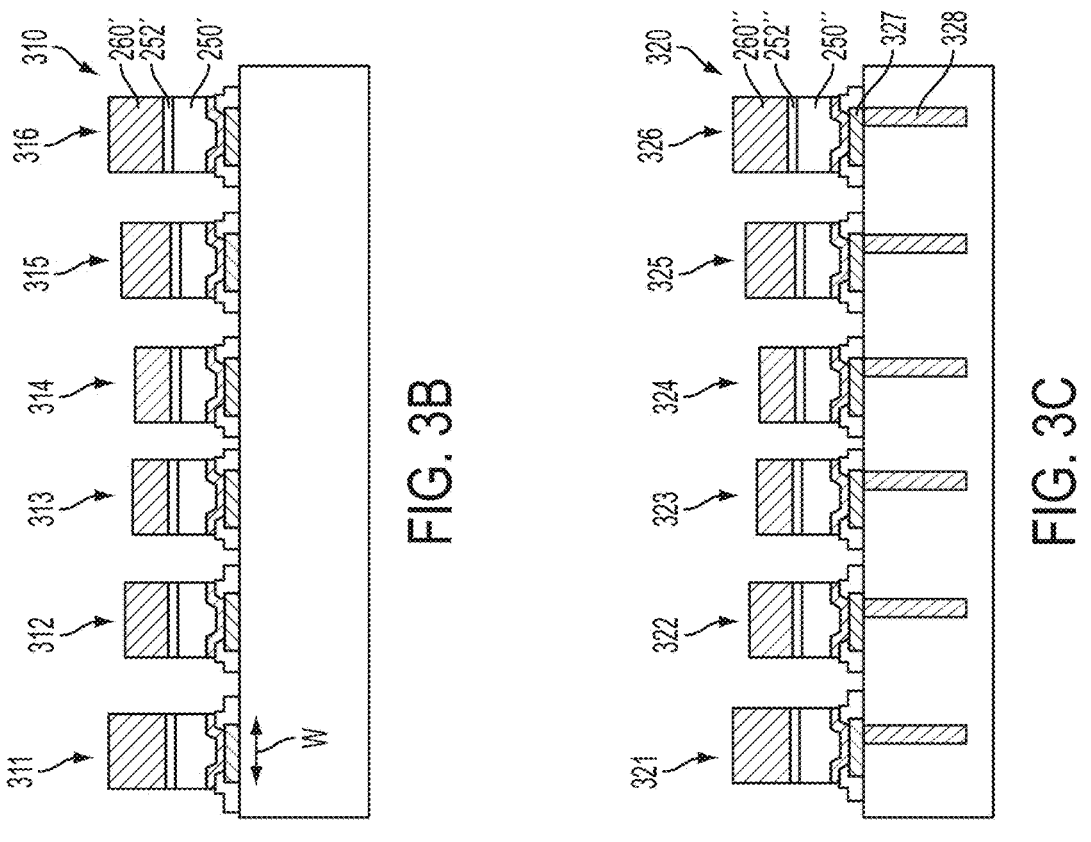
FIG. 3B
FIG. 3C
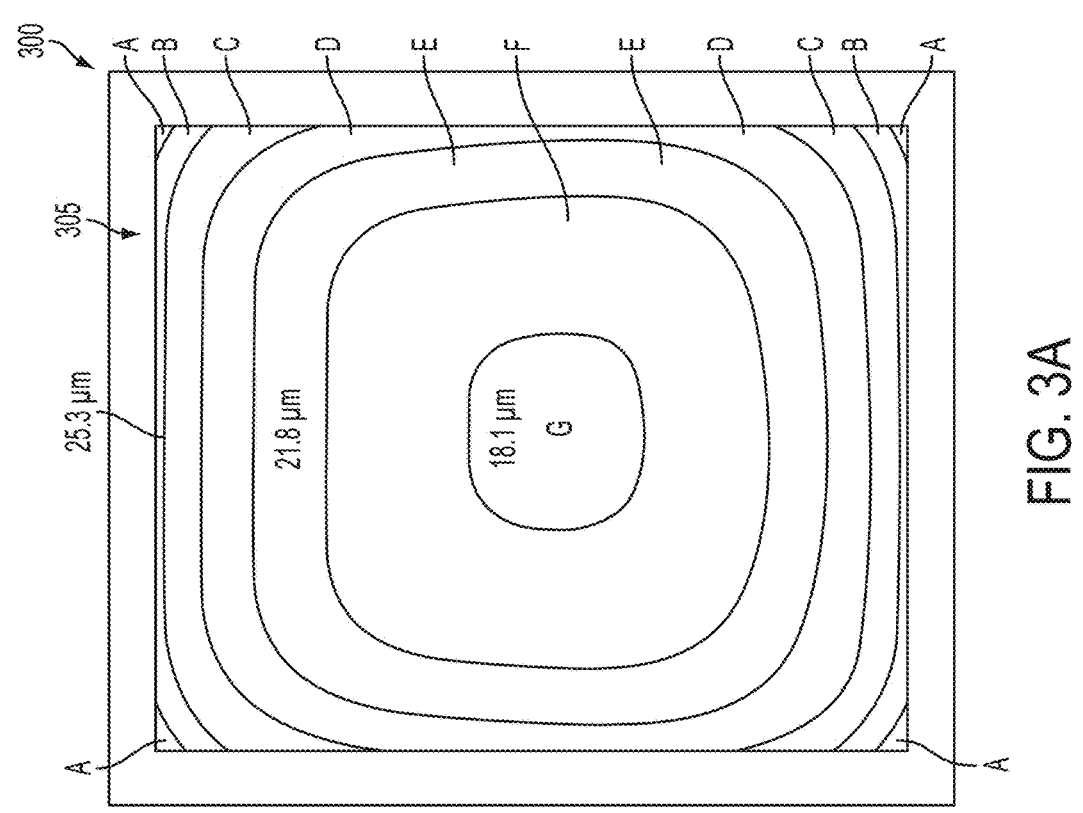
FIG. 3A

+V ANODE ELECTRODE

BOUNDARY LAYER

FLOW DIRECTION          ION MOBILITY PROFILE

PHOTORESIST

-V CATHODE ELECTRODE

METHOD OF MAKING SEMICONDUCTOR DEVICE HAVING REDUCED BUMP HEIGHT VARIATION

PRIORITY CLAIM

The present application is a continuation of U.S. application Ser. No. 16/936,112, filed Jul. 22, 2020, now U.S. Pat. No. 11,935,866, issued Mar. 19, 2024, which is a continuation of U.S. application Ser. No. 15/497,669, filed Apr. 26, 2017, now U.S. Pat. No. 10,741,520, issued Aug. 11, 2020, which is a divisional of U.S. application Ser. No. 13/403, 511, filed Feb. 23, 2012, now U.S. Pat. No. 9,646,942, issued May 9, 2017, which are incorporated herein by reference in their entireties.

RELATED APPLICATION

This application relates to the following co-pending and commonly assigned patent application: patent application Ser. No. 13/308,162, filed Nov. 30, 2011, now U.S. Pat. No. 8,653,658, issued Feb. 18, 2014, which is incorporated herein in its entirety.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed (or diced) from the wafer and packaged. The packaging processes have two main purposes: to protect delicate semiconductor chips, and to connect interior integrated circuits to exterior connections.

In packaging integrated circuit (IC) dies (or chips), solder joining is one of the commonly used methods for bonding IC dies to package substrates, which may or may not include integrated circuits and/or other passive components. The packaged substrates may also include through silicon vias (TSVs). There are many challenges in IC packaging.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3A is a standoff distribution of an IC chip, in accordance with some embodiments.

FIGS. 3B and 3C are cross sectional views of a chip and a substrate after a solder layer is plated on the chip and the substrate respectively, in accordance with some embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1:
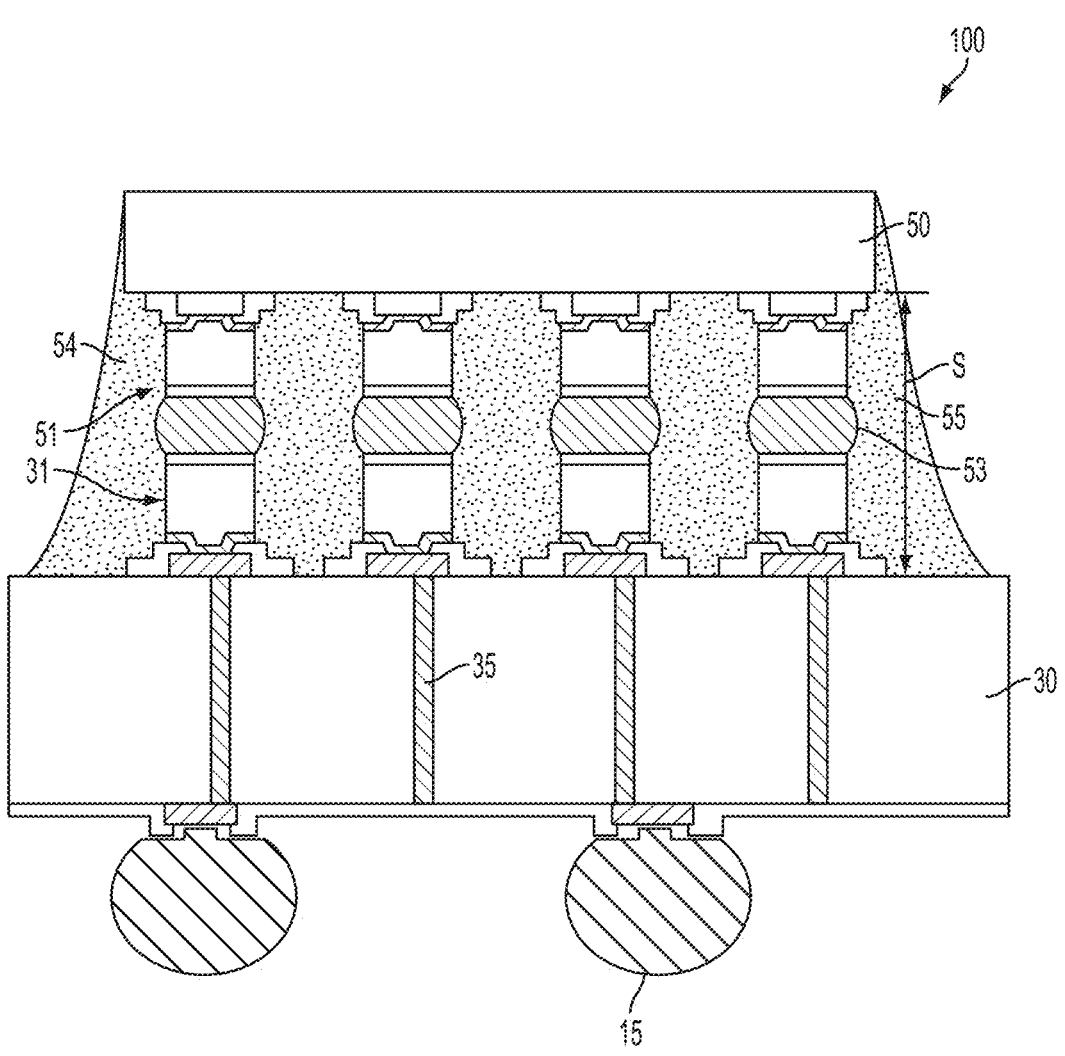
FIG. 1 is a cross-sectional view of a chip package with integrated circuit (IC) die on a substrate, in accordance with some embodiments.

FIG. 1 is a cross-sectional view of a chip package 100 having a packaged integrated circuit (IC) die 50 on a substrate 30, in accordance with some embodiments. In some embodiments, substrate 30 includes silicon, gallium arsenide, silicon on insulator ("SOI") or other similar materials. In some embodiments, substrate 30 also includes passive devices such as resistors, capacitors, inductors and the like, or active devices such as transistors. Substrate 30, in some exemplary embodiments, may further include additional integrated circuits. In some embodiments, substrate 30 includes through substrate vias 35, as shown in FIG. 1. In some embodiments, substrate 30 is an interposer. In addition, the substrate 30 is of other materials, in alternative embodiments. For example, in some embodiments, substrate 30 is a multiple layer circuit board. In some embodiments, substrate 30 includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive connector terminals 15.

Packaged IC die 50 is bonded to substrate 30 by connecting bumps 51 on IC die 50 to bumps 31 on substrate 30 to form bump structures 55. The space between die 50 substrate 30 may be filled with an underfill 54, which provides support for packaged IC die 50 and prevents cracking of solder joints 53 between bump structures 31 and 51. The distance between packaged IC die 50 and substrate 30, S, is called the "standoff" of chip package 100.

Figure 2A:
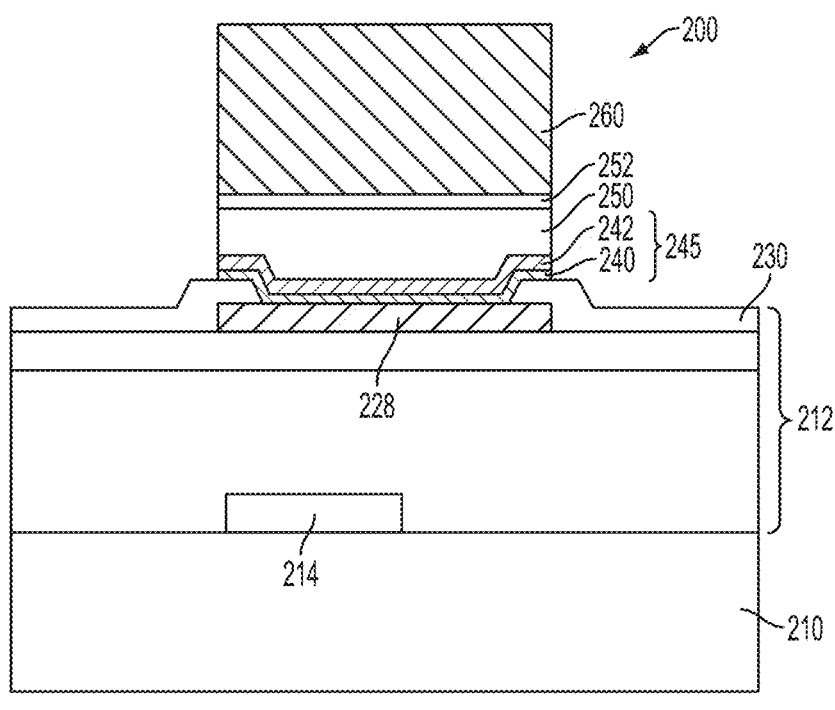
FIGS. 2A and 2B are two cross-sectional views of bump structures, in accordance with some embodiments.

FIG. 2A is a cross-sectional view of bump structure 200 having a substrate 210, in accordance with some embodiments. In some embodiments, substrate 210 is a semiconductor substrate, such as a bulk silicon substrate, although it may include other semiconductor materials, such as group III, group IV, and/or group V elements. In some embodiments, semiconductor devices 214, such as transistors, are formed at the surface of substrate 210. An interconnect structure 212, which includes metal lines and vias (not shown) formed therein and connected to semiconductor devices 214, is formed over substrate 210. In some embodiments, the metal lines and vias are formed of copper or copper alloys, and are formed using the well-known damascene processes. In some embodiments, interconnect structure 212 includes commonly known inter-layer dielectrics (ILDs) and inter-metal dielectrics (IMDs).

Bump structure 200 includes a metal pad 228 formed over an interconnect structure 212. In some embodiments, metal pad 228 comprises aluminum, and hence be referred to as aluminum pad 228. In other embodiments, metal pad 228 is formed of, or includes, other materials, such as copper, silver, gold, nickel, tungsten, alloys thereof, and/or multilayers thereof. In some embodiments, metal pad 228 is electrically connected to semiconductor devices 214, for example, through underlying interconnection structure 212. In some embodiments, a passivation layer 230 is formed to cover edge portions of metal pad 228. In some embodiments, the passivation layer 230 is formed of polyimide or other known dielectric materials. In some embodiments, additional passivation layers are formed over interconnect structure 212 and at the same level, or over, metal pad 228. In some embodiments, the additional passivation layers are formed of materials such as silicon oxide, silicon nitride, un-doped silicate glass (USG), polyimide, and/or multilayers thereof.

An opening is formed in passivation layer 230, exposing metal pad 228. A diffusion barrier layer 240 and a thin seed layer 242 are formed to cover the opening with the diffusion barrier layer 240 in contact with the metal pad 228. In some embodiments, diffusion barrier layer 240 is a titanium layer, a titanium nitride layer, a tantalum layer, or a tantalum nitride layer. In some embodiments, the materials of seed layer 242 include copper or copper alloys, and hence seed layer 242 is referred to as copper seed layer 242 hereinafter. In some embodiments, other metals, such as silver, gold, aluminum, and combinations thereof, are included in copper seed layer 242. In some embodiments, diffusion barrier layer 240 and copper seed layer 242 are formed using sputtering. The combined diffusion barrier layer 240 and copper seed layer 242 is referred to as an under bump metallurgy (UBM) layer 245.

A mask is formed over the copper seed layer 242 to allow a copper layer 250 to be plated on the exposed surface of copper seed layer 242, in accordance with some embodiments. In some embodiments, an optional metal layer 252 is on the copper layer 250. In some embodiments, optional metal layer 252 is a nickel-containing layer comprising, for example, a nickel layer or a nickel alloy layer. A solder layer 260 is over optional metal layer 252. In some embodiments, solder layer 260 is a lead-free pre-solder layer formed of, for example, SnAg, or a solder material, including alloys of tin, lead, silver, copper, nickel, bismuth, or combinations thereof. In some embodiments, the optional metal layer 252 and the solder layer 260 are also plated on the substrate.

After the conductive layers are plated, the mask is removed, exposing portions of copper seed layer 242 underlying the mask. The exposed portions of copper seed layer

242 are then removed by an etching process. Next, the exposed portions of diffusion barrier layer 240 are also removed. In FIG. 2A, the thickness of copper layer 250 is smaller than the thickness of solder layer 260; thus the bump structure is referred to as a solder bump 200.

Figure 2B:
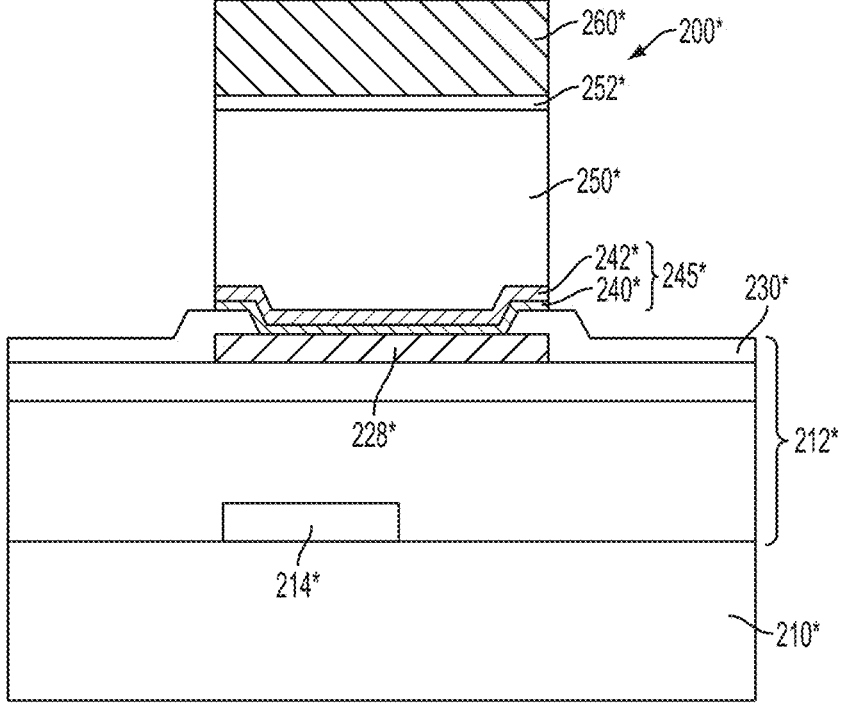

The elements of FIG. 2B are similar to the elements of 2A. For example, a substrate 210\* is similar to substrate 210; an interconnect structure 212\* is similar to interconnect structure 212; a semiconductor device 214\* is similar to semiconductor device 214; a metal pad 228\* is similar to metal pad 228; a diffusion barrier layer 240\* is similar to diffusion barrier layer 240; a seed layer 242\* is similar to copper seed layer 242; a copper layer 250\* is similar to copper layer 250; a metal layer 252\* is similar to metal layer 252; and a solder layer 260\* is similar to solder layer 260. The combination of the diffusion layer 240\* and the thin seed layer 242\* is called an UBM layer 245\*. However, the thickness of copper layer 250\* is larger than the thickness of the solder layer 260\*, thus the bump structure is referred to as a copper post (or pillar) bump structure 200\*, in accordance with some embodiments.

In some embodiments, the copper layer 250\* has a thickness in a range from about 3 μm to about 25 μm. In some embodiments, the metal layer 252\* has a thickness in a range from about 0.5 μm to about 3.5 μm. In some embodiments, the solder layer 260\* has a thickness in a range from about 3 μm to about 15 μm.

The embodiments shown in FIGS. 2A and 2B are merely examples; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

As described above, copper layers 250 and 250\*, metal layers 252 and 252\*, and the solder layers 260 and 260\* in FIGS. 2A and 2B are deposited by plating, in accordance with some embodiments. The plating processes used to plate layers 250, 252, and 260 could be electro-chemical plating, which is affected by a number of factors including plating current density, pattern density of bumps, size of the chip, etc.

FIG. 3A is a standoff distribution of an IC chip 300, in accordance with some embodiments. Bumps are formed in region 305 and bump heights vary across IC chip 300. The area outside region 305 does not have bumps. FIG. 3A shows that bump height across region 305 could be divided into different regions, such as region A, B, C, D, E, F, and G of bump height measurement. Each region has a different average bump height. The bumps on IC chip 300 are uniformly distributed across chip 300. The bump height distribution on chip 300 shows higher bump heights near the edges of chip 300 and lower bump heights at the center of chip 300. For example, region B has an average bump height of about 25.3 μm and region D has an average bump height of about 21.8 μm. Regions A, B and C are close to the edges of die 300. In contrast, region G is near the center (or away from edges) of chip 300 and has the lowest average bump height of about 18.1 μm.

The large variation of average bump heights from center to edges of region 305 is attributed to current density variation across region 305 during plating. The plating current density is highest at the edges and decreases toward the middle of region 305. This is due to lack of pattern surrounding the edges. As a result, the current near and outside region 305 goes to edge region, which causes a higher current density near edges than near center of region 305. In addition, the depletion of plating chemistry near the center of region 305 may also play a role in the distribution of average bump heights.

FIG. 3B is a cross-sectional of a packaged chip 310 after the plating of solder layer is completed, in accordance with some embodiments. FIG. 3B shows bumps on packages chip 310 are similar to bump 200* of FIG. 2B, in accordance with some embodiments. The cross-sectional view of FIG. 3B shows packages chip 310 includes a number of copper pillar bumps, 311-316, which have a copper layer 250', a metal layer 252', and a solder layer 260'. In some embodiments, the width W of copper layer 250' is equal to less than about 30 μm. Copper layer 250', metal layer 252', and solder layer 260' are all deposited by plating in this embodiment. As shown in FIG. 3B, bumps 311 and 316 near the edges of the packaged chip 310 are taller than bumps 313 and 314 near the center of packaged chip 310. As mentioned above, the difference in bump height is caused by higher plating current density near the edges.

FIG. 3C is a cross sectional view of a substrate (or package substrate) 320 after the plating of solder layer is completed, in accordance with some embodiments. FIG. 3C shows that substrate 320 has through silicon vias 328 under metal pad 327, in accordance with some embodiments. Substrate 320 is to be bonded with packaged chip 310. Therefore, the pattern of bumps on substrate 320 correlates with the pattern of bumps on packaged chip 310. Substrate 320 is an interposer, in accordance with some embodiments. Bumps on substrate 320 are similar to bump 200* of FIG. 2B, in accordance with some embodiments. Substrate 320 has copper pillar structures 321-326, which have a copper layer 250", a metal layer 252", and a solder layer 260". Copper layer 250", metal layer 252", and solder layer 260" are all deposited by plating in this embodiment. Copper pillar structures 321-326 of substrate 320 are used to bond copper pillar structures 311-316 of packaged chip 310. The variation in bump heights from center to edges makes bonding difficult.

Figure 3D:
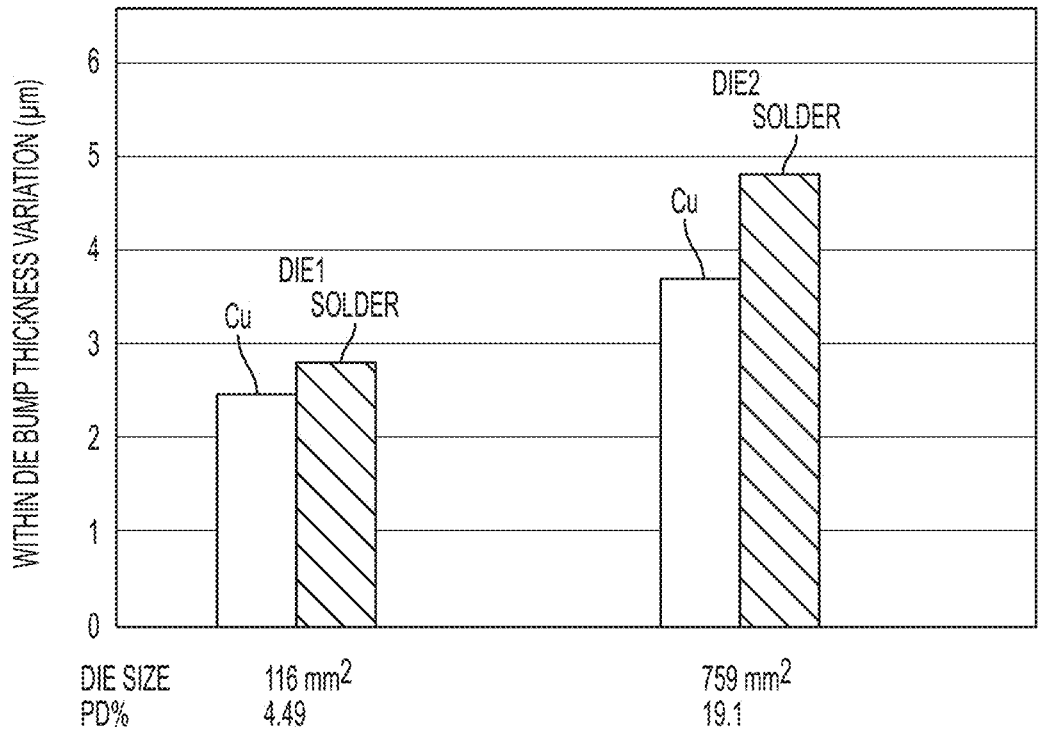
FIG. 3D is a graph of thickness variation of a copper layer and a solder layer of two dies, in accordance with some embodiments.

As mentioned above, bump plating is also affected by the chip size and bump density. Chips with larger chip size and higher bump density have larger current density variation than chips with smaller chip size and lower bump density. In addition, a chemical depletion effect for chips that are larger and with higher bump densities is more severe. As a result, larger chips (or dies) and chips with higher bump densities have more significant bump height variation (center to edges) than chips that are smaller and with lower bump densities. FIG. 3D is a graph of thickness variation of copper layer 250' and solder layer 260' of two dies, in accordance with some embodiments. One die has a die size of about 116 mm² and a pattern density (PD) of about 4.49% and the other has a die size of about 759 mm² and a PD of about 19.01%. Pattern density (PD) is defined as the ratio of plating surface of a die covered by patterns to the total surface area. Data in FIG. 3D show that higher die size and pattern density make thickness variation of copper layer 250' and solder layer 260' more pronounced.

Figure 3E:
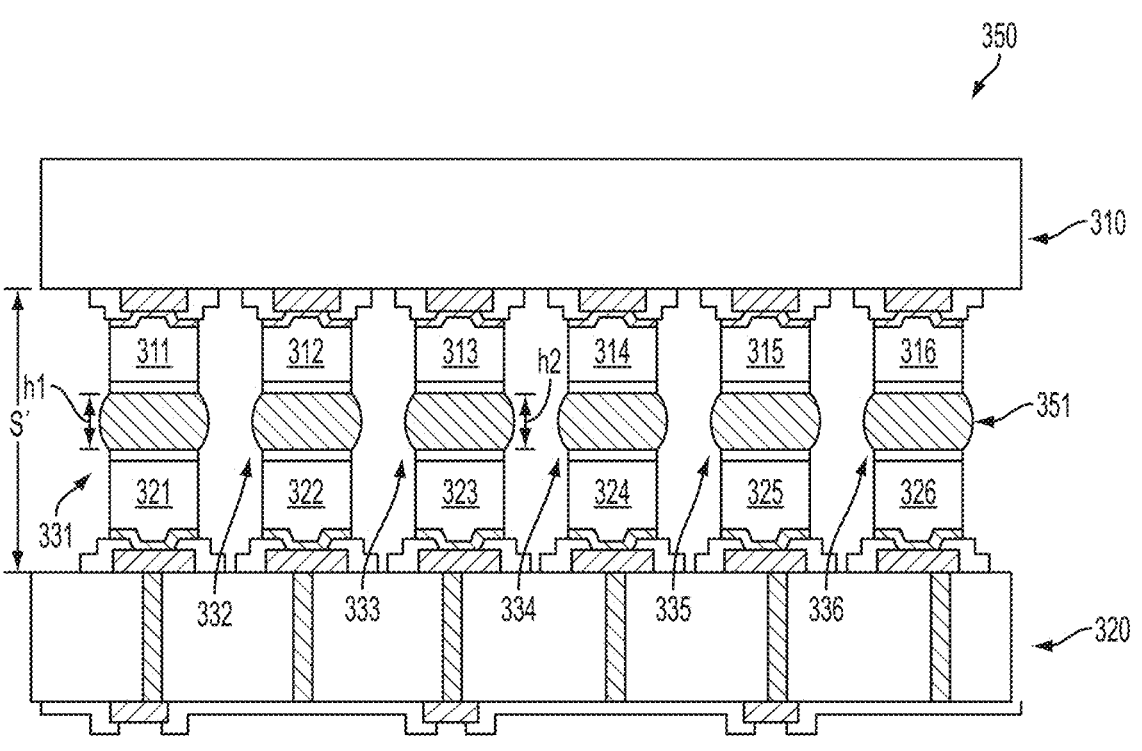
FIG. 3E is a cross-sectional view of a packaged chip being bonded to substrate to form a chip package, in accordance with some embodiments.

FIG. 3E is a packaged chip 310 being bonded to substrate 320 to form a chip package 350, in accordance with some embodiments. Bumps 311-316 of packaged chip 310 are bonded to bumps 321-326 of substrate 320 to form bump structures 331-336, in accordance with some embodiments. The standoff between packaged chip 310 and substrate 320 is S', as shown in FIG. 3E. Since bumps 311-316 of packaged chip 310 are taller (or thicker) near the edges and bumps 321-326 of substrate 320 are also taller near the edges, the solder layer 351 of edge bump structures, such as 331 and 336 is shorter compared to other bumps, such as 332-334, to make the standoff S' constant. FIG. 3E shows the height of bump structure 331 is h₁ and the height of bump structure 333 is h₂. Since bump structure 331 is near the edge and bump structure 333 is near the center, h₁ is shorter than h₂. Solder layer 351 of the edge bumps is squeezed to extend toward the sides and could come in contact with neighboring bumps. As shown in FIG. 3E, solder layer 351 of edge bump structure 331 comes into contact with bump structure 332. Solder bridging causes undesirable signal errors and chip failure. The bridged solder layer 351 could make flux cleaning more difficult and consequently causes problems for the formation of underfill. FIG. 3E also shows that some solder layer 351 of bump structure 336 overflows the covers the sidewall of copper post 316, which may also be called as wetting of solder on sidewalls of copper post. Solder wetting on copper post could increase the risk of shorting and degradation of copper pillar due to formation of inter-metal compound (IMC) between copper and solder.

Figures 4A, 4B:
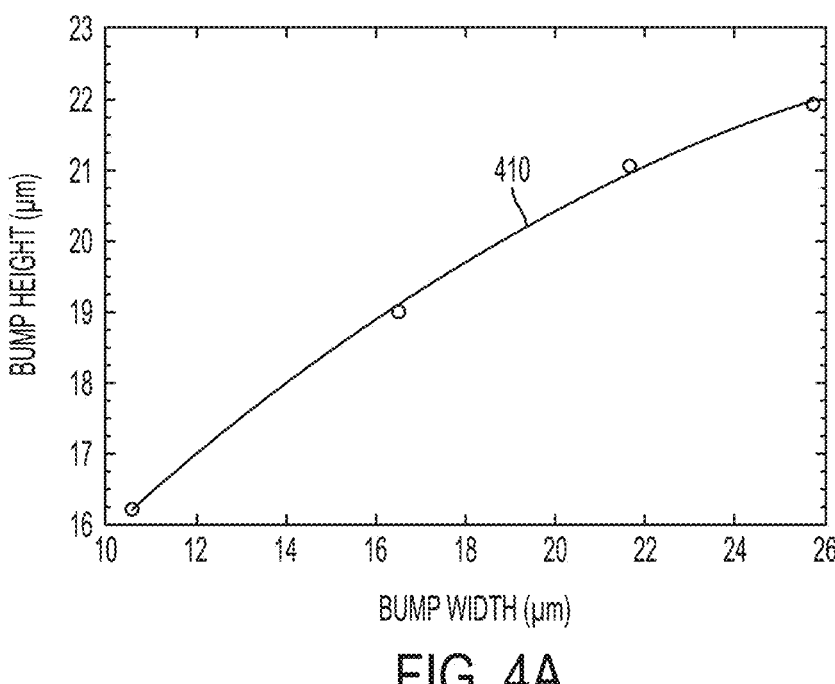
FIG. 4A is a correlation diagram between bump height and bump width, in accordance with some embodiments.
FIG. 4B is a schematic diagram of plating in openings with different sizes, in accordance with some embodiments.

Based on the description of FIG. 3E, variation of bump heights within a package chip and/or a package substrate is undesirable. FIG. 4A is a correlation diagram of bump height versus bump width, or critical dimension (CD) of the bump, in accordance with some embodiments. Critical dimension (CD), which is a minimal feature size of an opening in lithography. The experimental data falls on curve 410. In this study, the top views of the bumps are circular and the space between bumps is kept the same regardless of bump size and the bumps are evening distributed across the study area. The bumps studied are placed in the same region with similar surroundings. The data show that bump height increases as the width of bumps increases. Such results could be attributed to higher current flowing to bumps with larger widths than narrower bumps. During plating of conductive materials to fill openings, there is a boundary layer along the inside walls of the openings, as shown in FIG. 4B, in accordance with some embodiments. Ion mobility is lower in the boundary layer. For smaller opening 420, the boundary layer 421 occupies a large portion of the opening. In contrast, for a larger opening 430, the boundary layer 421 occupies a smaller portion of the opening, in compared to opening 420. As a result, a deposited thickness T₁ in opening 420 is lower than a thickness T₂ in opening 430.

The data on curve 410 indicates that bump height can be controlled by the CD of the bump. In order to reduce the height of bumps at the edges of a packaged chip or substrate to make the heights of bumps consistent, the width of bumps near the edges can be designed to be smaller than the center bumps to lower the bump heights of edge bumps.

Figure 4C:
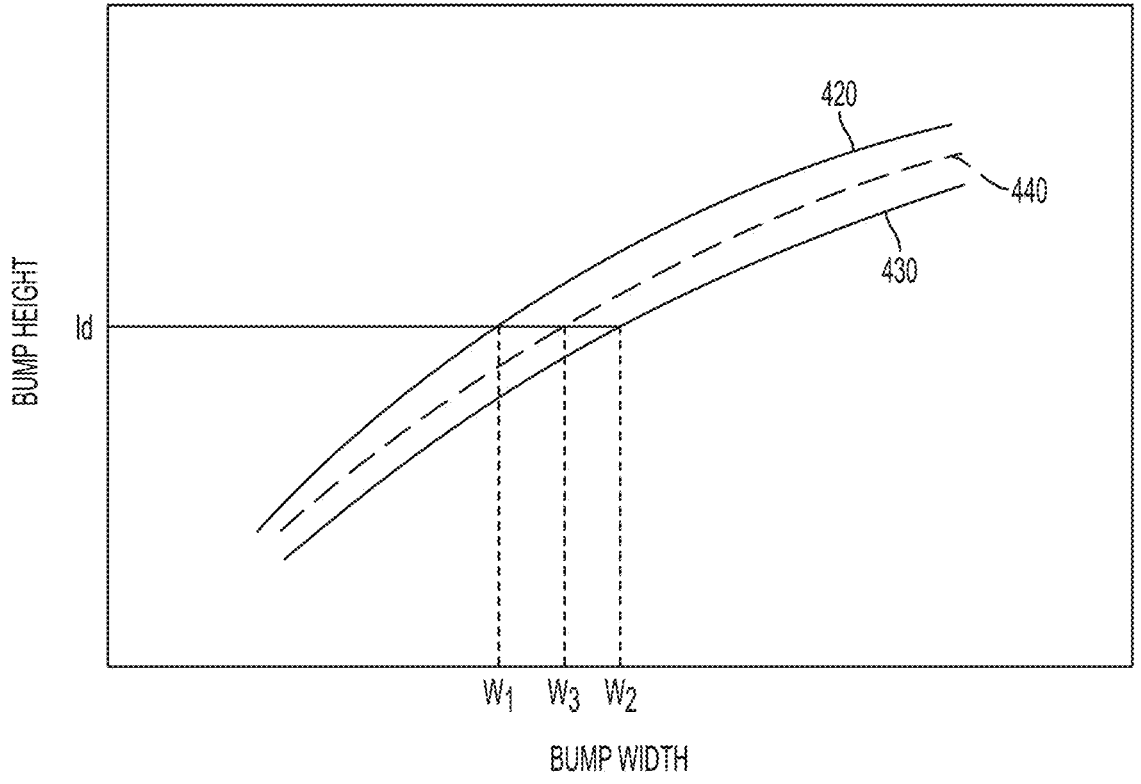
FIG. 4C is a correlation diagram between bump height and bump width for different regions on a package chip or substrate, in accordance with some embodiments.

As mentioned above, plating of bumps can be affected by a number of factors, which include pattern, pattern density, and location of the bumps (such as center versus edge). FIG. 4C is a correlation diagram of bump height and width of bumps for bumps in different regions on a packaged chip, in accordance with some embodiments. Similar correlation can be drawn for bumps on a substrate to bond with the chip. FIG. 4C shows a curve 420 for bumps near the edge of the chip. The edge bumps have a certain pattern. Curve 430 is for bumps near the center of the chip. As described above in FIG. 4A, bump heights increase with widths of bumps. FIG. 4C shows that when the bump height is set at "H", the width of bumps at the edge can be set at W₁ and the width of bumps at the center can be set at W₂. The different widths enable bumps formed near the center and bumps formed near the edge(s) to have equal bump heights. Dotted curve 440 is for bumps between center and edges of the chip. If there are bumps that fall on curve 440, such bumps may be designed with bump width $W_3$, in accordance with some embodiments.

Figure 5A:
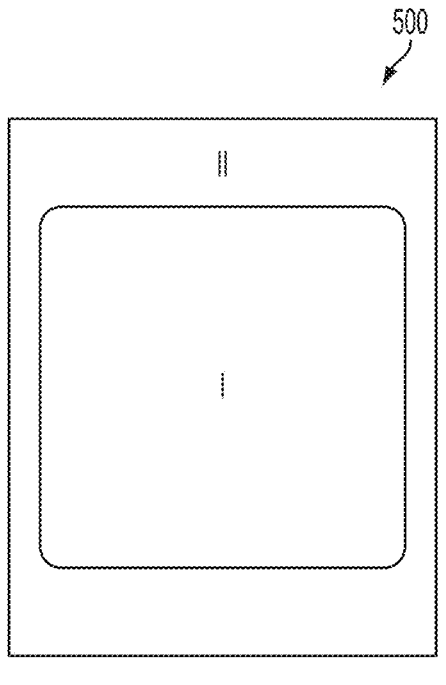
FIG. 5A is a diagram of two zones of bump widths on a substrate, in accordance with some embodiments.

FIG. 5A is a diagram of two zones of bump widths on a substrate 500, in accordance with some embodiments. Zone I is near the center and zone II is near the edge(s). Bumps in Zones I and II are designed to have a same width in each of the respective zones. Bumps in Zone I are designed to be wider than bumps in Zone II. In some embodiments, the widths of bumps in zone I are wider than the widths of bumps in zone II in a range from about 5% to about 50%. The shape of zone I follows substantially the outline of bump regions, in accordance with some embodiments. In some embodiments, the widths of the bumps in various zones are in a range from about 5 μm to about 50 μm.

Figure 5B:
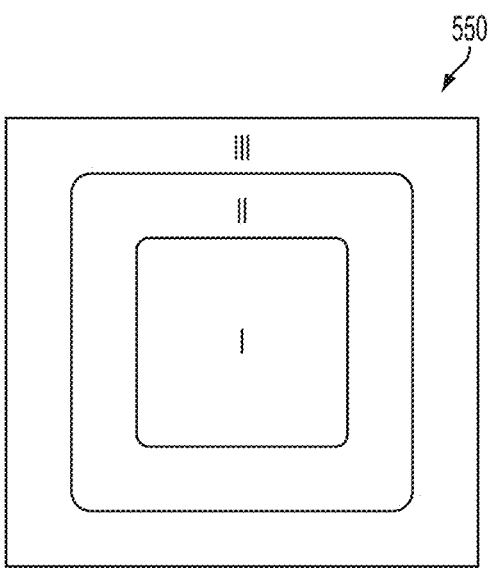
FIG. 5B is a diagram of three zones of bump width on a substrate, in accordance with some embodiments.

Bumps on different chips or substrate could have different bump patterns and distribution of bump heights. For example, the bump design could be divided into three or more zones with bump widths of bumps in each zone being the same. FIG. 5B is a diagram of three zones of bump widths on a substrate 550. Bumps in zone I have the largest width and bumps in zone III have the smallest width. The width (or size) of bumps in zone II is between zones I and III.

Figure 5C:
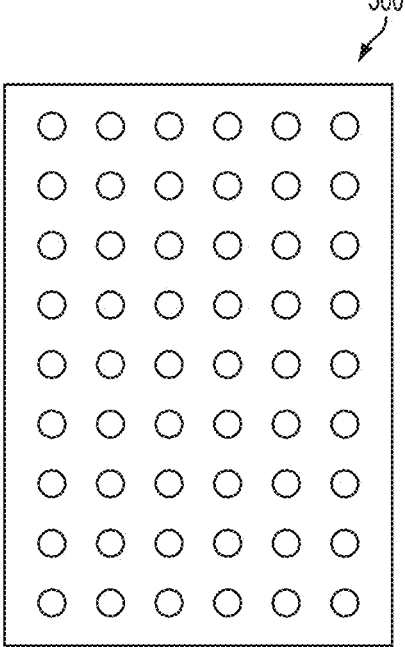
FIG. 5C is a diagram of a substrate with bumps covering most of a surface of the substrate, in accordance with some embodiments.
Figure 5D:
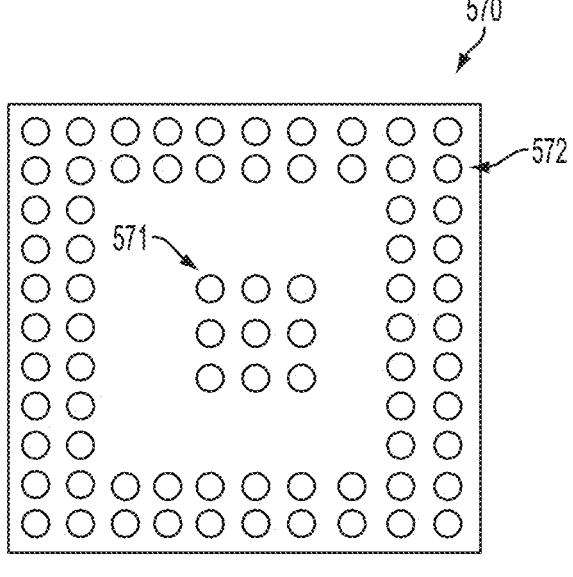
FIG. 5D is a diagram of a substrate with bumps near a center of substrate and bumps near edges of substrate, in accordance with some embodiments.

The bumps on packaged chips and/or substrates can fill (or cover) most of the surfaces of bump formation areas. FIG. 5C is a diagram of a substrate 560 with bumps covering most of a surface of substrate 560, in accordance with some embodiments. Alternatively, some packaged chip or package substrate could have bumps covering only portions of surfaces. FIG. 5D is a diagram of a substrate 570 with bumps 571 near a center of substrate 570 and bumps 572 near edges of substrate 570, in accordance with some embodiments. Different pattern and density of bumps affect the bump height and width correlation curve. Using bumps with different widths in different regions applies for different bump patterns. For example, bumps 571 are larger (or wider) than bumps 572.

To control the distribution and/or uniformity of bump heights, dummy bumps may be used. Dummy bumps, which do not connect electrically to devices, may be located at die edge or near die center. They can be designed to be placed at strategic locations to improve the uniformity of bump heights across die and also to control bump heights. The width of the dummy bumps can be designed in a manner similar to signal bumps (or real bumps). For example, some of bumps 571 and 572 could be dummy bumps. Alternatively, dummy bumps can be added in the space between bumps 571 and 572. The widths of the dummy bumps between bumps 571 and 572 can be designed to be between the widths of bumps 571 and 572.

Figure 6A:
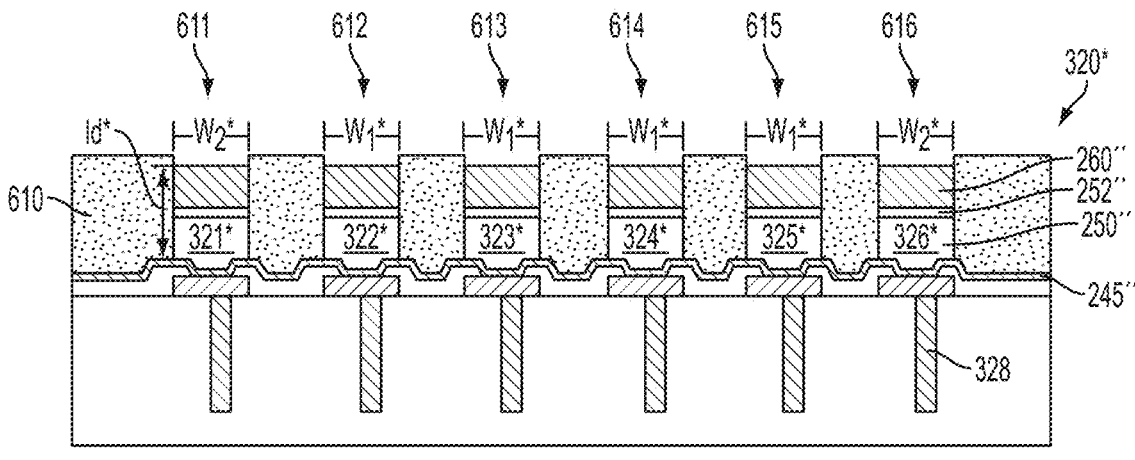
FIG. 6A is a cross-sectional view of a substrate after conductive layers are plated on the substrate to form bumps, in accordance with some embodiments.

FIG. 6A is a cross-sectional view of a substrate 320* after conductive layers are plated on the substrate 320*, in accordance with some embodiments. Each of bumps 611-616 in FIG. 6A includes a copper layer 250" and a metal layer 252". The copper layer 250", the metal layer 252", and the solder layer 260" are plated on substrate 320* after a photoresist 610 is formed on substrate 320*. The photoresist 610 is formed after an UBM layer 245" is formed on substrate 320*. In some embodiments, the photoresist 610 is a wet photoresist or a dry photoresist. In some embodiments, the UBM layer 245" includes a diffusion layer and a thin seed layer. As described above, the bump height varies from a center of substrate 320* to edges of substrate 320*. As shown in FIG. 6A, widths of both bumps 321* and 326* are $W_2$* and width of bumps 322*-325* are all $W_1$*. $W_2$* is narrower than $W_1$*. Due to the narrower widths of bumps 611 and 616, bumps 611-616 have about the same height H*.

Figure 6B:
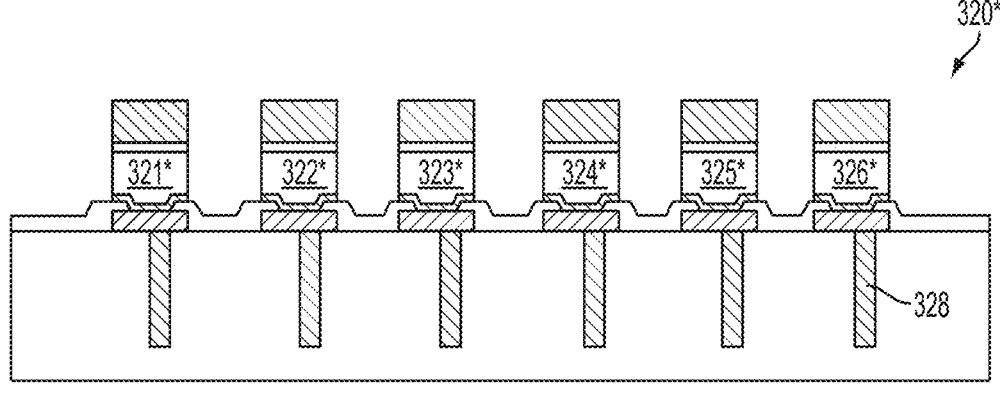
FIG. 6B is a cross-sectional view of the substrate of FIG. 6A after photoresist and excess conductive layers have been removed, in accordance with some embodiments.

FIG. 6B is a cross sectional view of substrate 320* after the photoresist layer 610 is removed and the exposed UBM layer 245" is etched, in accordance with some embodiments. A workpiece (not shown) that holds substrate 320* is then separated from substrate 320*. In some embodiments, substrate 320* undergoes backside grinding to expose TSVs 328 and to form structures for external electrical connection. In some embodiments, substrate 320* includes a number of dies and the dies are sawed (or diced) and separated from substrate 320* to form individual die, in accordance with some embodiments.

A packaged chip being bonded to substrate 320* has the same bump pattern as substrate 320*. The bump design and formation of the packaged chip should follow the same pattern as substrate 320*. Bumps on substrate 320* and the chip being bonded together prepared by the mechanisms above are of similar heights on the substrate and the packaged chip respectively, which allow bonding of bumps without the issues mentioned above.

Figure 6C:
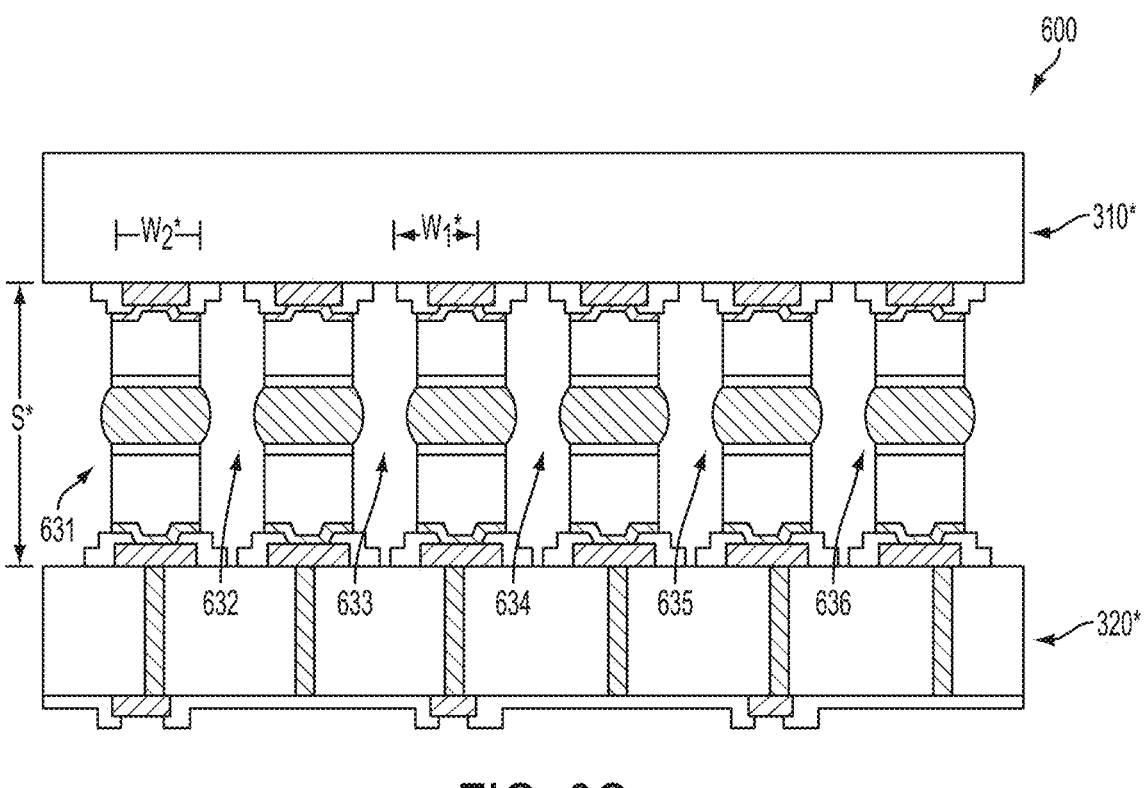
FIG. 6C is a cross-sectional view of a chip package with a packaged die being bonded to substrate, in accordance with some embodiments.

FIG. 6C is a chip package 600 with a packaged chip 310* being bonded to substrate 320*, in accordance with some embodiments. Packaged chip 310* is also prepared with bumps having smaller widths near the edges in a manner similar to substrate 320*. Bumps on packaged chip 310* and substrate 320* form bump structures 631-636. Bump widths of bump structures 631 and 636 are $W_2$*, which is smaller than a bump width $W_1$* of bumps 632-635. Since the bumps 631 and 636 near the edges are smaller (in width), the bump heights across packaged chip 310* and substrate 320* are about the same. As a result, bump structures 631-636 are formed without squeezing excess solder outward to touch neighboring bump structure(s) or to cover the sidewalls of copper layer(s) of bump structures. With properly formed bump structures, an underfill can be formed properly between packaged chip 310* and substrate 320*.

Figure 6D:
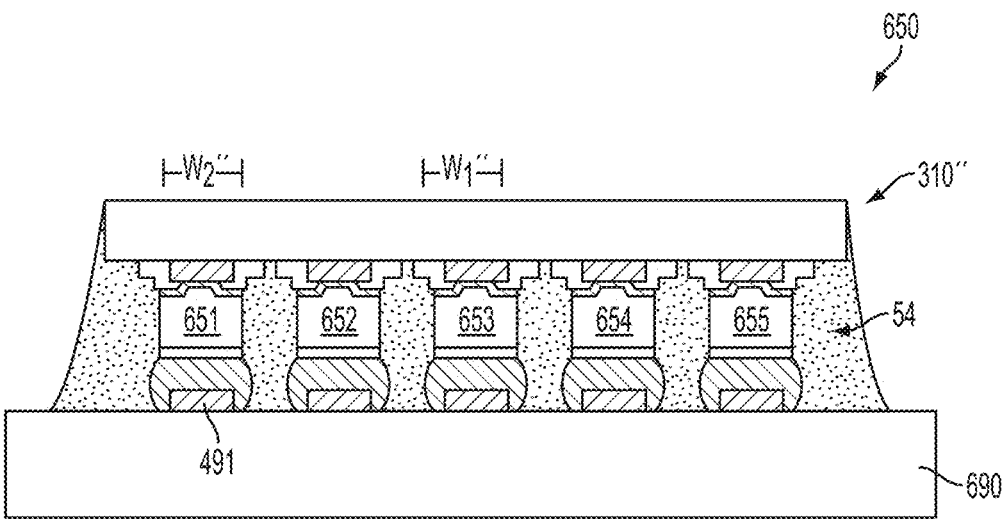
FIG. 6D is a cross-sectional view of a chip package with a packed chip on a substrate, in accordance with some embodiments.

The exemplary chip packages described above involve chips on substrates with bump structures. However, in some embodiments, the application of planarizing bump structures is applied to chip packages involving packaged chips on package substrates without bump structures. FIG. 6D is a chip package 650 with a packed chip 310" on a substrate 690, in accordance with some embodiments. Chip package 650 has bump structures 651-655 bonded to conductive traces 491. Bump structures near an edge, such as bumps 651 and 655, have smaller widths ($W_2$") than bump structures near a center of the package ($W_1$"), such as bump structures 652-654.

The mechanisms for forming bumps on packaged dies and package substrates reduce variation of bump heights across the packaged dies and packaged substrates. Bumps are designed to have different widths to counter the higher plating current near the edge(s) of dies or substrates. Bump sizes can be divided into different zones depending on the bump patterns and densities across the packaged die and/or substrates. Smaller bumps near edges reduce the thickness of plated film(s), which would have been thicker due to higher plating current density near the edges. As a result, the bump heights across the packaged dies and/or substrates can be kept significantly constant and chip package can be properly formed.

In accordance with some embodiments, a chip package is provided. The chip package includes a packaged chip, and a substrate. The chip package also includes a plurality of bump structures between a packaged chip and a substrate, and bump structures near an edge of the chip package have widths smaller than bumps structures near a center of the chip package by an amount ranging from about 5% to about 50%.

In accordance with some other embodiments, a substrate is provided. The substrate includes a plurality of bumps and each of the plurality of bumps includes a solder layer and a copper layer. Bumps near an edge of the chip package have widths smaller than bumps near a center of the chip package by an amount ranging from about 5% to about 50%.

In accordance with yet some other embodiments, a method of forming a chip package is provided. The method includes providing a packaged chip with a plurality of bumps, and bumps near an edge of the packaged chip have widths smaller than bumps near a center of the chip package by an amount ranging from about 5% to about 50%. The method also includes providing a substrate with a plurality of bumps, and bumps near an edge of the substrate have widths smaller than bumps near a center of the substrate by an amount ranging from about 5% to about 50%. The patterns and widths of bumps on the packaged chip and the substrate are substantially the same. The method further includes bonding the plurality of bumps on the package chips with the plurality of bumps on the substrate to form the chip package.

An aspect of this description relates to a method of making a semiconductor device. The method includes patterning a photoresist on a substrate, wherein patterning the photoresist comprises forming a plurality of openings in the photoresist, a first opening of the plurality of openings has a first width, a second opening of the plurality of openings has a second width smaller than the first width, a third opening of the plurality of openings is between the first opening and the second opening and has a third width different from the first width and the second width, and width is measured in a direction parallel to a top surface of the substrate. The method further includes plating a first conductive material into each opening of the plurality of openings in the photoresist. Plating the first conductive material includes plating of the first conductive material to a first height in the first opening, plating the first conductive material to a second height in the second opening, and plating the first conductive material to a third height in the third opening, wherein the third height is different from the first height and the second height. In some embodiments, the third width is less than the first width. In some embodiments, the third width is greater than the second width. In some embodiments, patterning the photoresist includes forming the third openings for dummy bumps. In some embodiments, the first height is equal to the second height. In some embodiments, the method further includes bonding the first conductive material to a package substrate. In some embodiments, bonding the first conductive material to the package substrate includes bonding the first conductive material to the package substrate using solder. In some embodiments, bonding the first conductive material to the package substrate includes bonding the first conductive material to one or more conductive pillars on the package substrate. In some embodiments, bonding the first conductive material to the package substrate includes bonding the first conductive material to one or more conductive traces on the package substrate. In some embodiments, the method further includes filling a space between the substrate and the package structure with an underfill material, wherein the underfill material is between adjacent pieces of the first conductive material.

An aspect of this description relates to a method of making a semiconductor device. The method includes forming a first plurality of bump structures on a substrate, wherein each of the first plurality of bump structures has a first width and a first height. The method further includes forming a second plurality of bump structures on the substrate, wherein each of the second plurality of bump structures has a second width and the first height, the second width is less than the first width, and the second plurality of bump structures surrounds the first plurality of bump structures. The method further includes bonding a package substrate to the first plurality of bump structures and the second plurality of bump structures, wherein a distance between a surface of the package substrate and a closest surface of each of the first plurality of bump structures is a first distance, and a distance between the surface of the package substrate and a closest surface of each of the second plurality of bump structures is the first distance. In some embodiments, the method further includes forming a plurality of third bump structures on the substrate, wherein the plurality of third bump structures is between the plurality of first bump structures and the plurality of second bump structures. In some embodiments, forming the plurality of third bump structures includes forming each of the plurality of third bump structures having a third width different from the first width and the second width. In some embodiments, the third width is less than the first width. In some embodiments, the third width is greater than the second width. In some embodiments, forming the plurality of third bump structures includes forming each of the plurality of third bump structures as a dummy bump structure. In some embodiments, bonding the package substrate to the first plurality of bump structures and the second plurality of bump structures includes bonding at least one of the first plurality of bump structures to a bump structure on the package substrate. In some embodiments, bonding the package substrate to the first plurality of bump structures and the second plurality of bump structures includes bonding at least one of the first plurality of bump structures directly to a conductive trace on the package substrate.

An aspect of this description relates to a method of making a semiconductor device. The method includes forming a first plurality of bump structures on a substrate, wherein each of the first plurality of bump structures has a first width. The method further includes depositing a first solder layer on each of the first plurality of bump structures, wherein a combined height of the first solder layer and a corresponding bump structure of the first plurality of bump structures is a first height. The method further includes forming a second plurality of bump structures on the substrate, wherein each of the second plurality of bump structures has a second width, the second width is less than the first width, and the second plurality of bump structures surrounds the first plurality of bump structures. The method further includes depositing a second solder layer on each of the second plurality of bump structures, wherein a combined height of the second solder layer and a corresponding bump structure of the second plurality of bump structures is the first height. The method further includes bonding a package substrate to the first plurality of bump structures and the second plurality of bump structures, wherein bonding the package substrate to the first plurality of bump structures includes bonding using the first solder layer, and bonding the package substrate to the second plurality of bump structures includes bonding using the second solder layer. In some embodiments, the method further includes forming a plurality of third bump structures on the substrate, wherein the plurality of third bump structures is between the plurality of first bump structures and the plurality of second bump structures, and each of the plurality of third bump structures has a third width different from the first width and the second width.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of making a semiconductor device, the method comprising:

patterning a photoresist on a substrate, wherein patterning the photoresist comprises forming a plurality of openings in the photoresist, a first opening of the plurality of openings has a first width, a second opening of the plurality of openings has a second width smaller than the first width, a third opening of the plurality of openings is between the first opening and the second opening and has a third width different from the first width and the second width, and width is measured in a direction parallel to a top surface of the substrate; and plating a first conductive material into each opening of the plurality of openings in the photoresist, wherein plating the first conductive material comprises:

plating of the first conductive material to a first height in the first opening, plating the first conductive material to a second height in the second opening, and plating the first conductive material to a third height in the third opening, wherein the third height is different from the first height and the second height.

2. The method of claim 1, wherein the third width is less than the first width.

3. The method of claim 1, wherein the third width is greater than the second width.

4. The method of claim 1, wherein patterning the photoresist comprises forming the third openings for dummy bumps.

5. The method of claim 1, wherein the first height is equal to the second height.

6. The method of claim 1, further comprising bonding the first conductive material to a package substrate.

7. The method of claim 6, wherein bonding the first conductive material to the package substrate comprises bonding the first conductive material to the package substrate using solder.

8. The method of claim 6, wherein bonding the first conductive material to the package substrate comprises bonding the first conductive material to one or more conductive pillars on the package substrate.

9. The method of claim 6, wherein bonding the first conductive material to the package substrate comprises bonding the first conductive material to one or more conductive traces on the package substrate.

10. The method of claim 6, further comprising filling a space between the substrate and the package structure with an underfill material, wherein the underfill material is between adjacent pieces of the first conductive material.

11. A method of making a semiconductor device, the method comprising:

forming a first plurality of bump structures on a substrate, wherein each of the first plurality of bump structures has a first width and a first height;

forming a second plurality of bump structures on the substrate, wherein each of the second plurality of bump structures has a second width and the first height, the second width is less than the first width, and the second plurality of bump structures surrounds the first plurality of bump structures; and bonding a package substrate to the first plurality of bump structures and the second plurality of bump structures, wherein a distance between a surface of the package substrate and a closest surface of each of the first plurality of bump structures is a first distance, a distance between the surface of the package substrate and a closest surface of each of the second plurality of bump structures is the first distance, and bonding the package substrate to the first plurality of bump structures and the second plurality of bump structures comprises bonding at least one of the first plurality of bump structures to a bump structure on the package substrate.

12. The method of claim 11, further comprising forming a plurality of third bump structures on the substrate, wherein the plurality of third bump structures is between the plurality of first bump structures and the plurality of second bump structures.

13. The method of claim 12, wherein forming the plurality of third bump structures comprises forming each of the plurality of third bump structures having a third width different from the first width and the second width.

14. The method of claim 13, wherein the third width is less than the first width.

15. The method of claim 13, wherein the third width is greater than the second width.

16. The method of claim 12, wherein forming the plurality of third bump structures comprises forming each of the plurality of third bump structures as a dummy bump structure.

17. The method of claim 11, wherein bonding the package substrate to the first plurality of bump structures and the second plurality of bump structures comprises bonding each of the first plurality of bump structures to a corresponding bump structure on the package substrate.

18. The method of claim 11, wherein bonding the package substrate to the first plurality of bump structures and the second plurality of bump structures comprises bonding at least one of the first plurality of bump structures directly to a conductive trace on the package substrate.

19. A method of making a semiconductor device, the method comprising:

forming a first plurality of bump structures on a substrate, wherein each of the first plurality of bump structures has a first width;

depositing a first solder layer on each of the first plurality of bump structures, wherein a combined height of the first solder layer and a corresponding bump structure of the first plurality of bump structures is a first height;

forming a second plurality of bump structures on the substrate, wherein each of the second plurality of bump structures has a second width, the second width is less than the first width, and the second plurality of bump structures surrounds the first plurality of bump structures;

depositing a second solder layer on each of the second plurality of bump structures, wherein a combined height of the second solder layer and a corresponding bump structure of the second plurality of bump structures is the first height; and bonding a package substrate to the first plurality of bump structures and the second plurality of bump structures, wherein bonding the package substrate to the first plurality of bump structures comprises bonding using the first solder layer, bonding the package substrate to the second plurality of bump structures comprises bonding using the second solder layer, wherein at least one of the first plurality of bump structures is physically between the package substrate and a surface of the substrate closest to the package substrate.

20. The method of claim 19, further comprising forming a plurality of third bump structures on the substrate, wherein the plurality of third bump structures is between the plurality of first bump structures and the plurality of second bump structures, and each of the plurality of third bump structures has a third width different from the first width and the second width.

\* \* \* \* \*